US009885502B2

(12) United States Patent
Yuan et al.

(10) Patent No.: US 9,885,502 B2
(45) Date of Patent: *Feb. 6, 2018

(54) METHODS AND SYSTEMS FOR SOLID STATE HEAT TRANSFER

(71) Applicant: The Aerospace Corporation, El Segundo, CA (US)

(72) Inventors: Sidney W. K. Yuan, Los Angeles, CA (US); Tung T. Lam, Fullerton, CA (US)

(73) Assignee: The Aerospace Corporation, El Segundo, CA (US)

( * ) Notice: Subject to any disclaimer, the term of this patent is extended or adjusted under 35 U.S.C. 154(b) by 561 days.

This patent is subject to a terminal disclaimer.

(21) Appl. No.: 14/535,770

(22) Filed: Nov. 7, 2014

(65) Prior Publication Data

US 2016/0169564 A1  Jun. 16, 2016

Related U.S. Application Data

(63) Continuation of application No. 13/050,555, filed on Mar. 17, 2011, now Pat. No. 8,904,809.

(51) Int. Cl.
```
F25B 21/02      (2006.01)
F25B 21/04      (2006.01)
F25B 40/00      (2006.01)
H01L 35/32      (2006.01)
F28F 13/00      (2006.01)
```
(52) U.S. Cl.
CPC .............. *F25B 21/04* (2013.01); *F25B 21/02* (2013.01); *H01L 35/32* (2013.01); *F28F 2013/008* (2013.01)

(58) Field of Classification Search
CPC .. F25B 21/02; F25B 21/04; F25B 2321/0212; F25B 47/022; F25B 40/00; F25D 2321/1412; F25D 21/04; F25D 21/14; H01L 35/00; H01L 35/30
USPC ........... 62/277, 3.7, 238.2; 165/96, 277, 276
See application file for complete search history.

(56) References Cited

U.S. PATENT DOCUMENTS

| | | | | |
|---|---|---|---|---|
| 5,867,990 | A * | 2/1999 | Ghoshal | F25B 21/02 165/185 |
| 5,884,485 | A * | 3/1999 | Yamaguchi | F25B 21/02 505/700 |
| 5,966,941 | A * | 10/1999 | Ghoshal | F25B 21/02 165/277 |
| 6,000,225 | A * | 12/1999 | Ghoshal | F25B 21/02 62/3.7 |

(Continued)

*Primary Examiner* — Mohammad M Ali
*Assistant Examiner* — Meraj A Shaikh
(74) *Attorney, Agent, or Firm* — K&L Gates LLP

(57) ABSTRACT

Various embodiments are directed to a thermoelectric device comprising a thermoelectric element, a first heat switch and a second heat switch. The thermoelectric element may comprise a first component in electrical contact with a second component at an interface. The first component may comprise a first material and the second component may comprise a second material different from the first material. The first heat switch may comprise a first terminal in thermal contact with the interface and a second terminal in thermal contact with a thermal reservoir. The second heat switch may comprise a first terminal in thermal contact with the interface and a second terminal in thermal contact with a thermal load.

21 Claims, 7 Drawing Sheets

(56) References Cited

U.S. PATENT DOCUMENTS

| | | | | |
|---|---|---|---|---|
| 6,161,388 A | * | 12/2000 | Ghoshal | F25B 21/02 |
| | | | | 62/3.7 |
| 6,588,217 B2 | * | 7/2003 | Ghoshal | H01L 23/38 |
| | | | | 257/E23.082 |
| 7,411,792 B2 | * | 8/2008 | Richards | B82Y 30/00 |
| | | | | 165/276 |
| 2012/0234526 A1 | * | 9/2012 | Yuan | F25B 21/04 |
| | | | | 165/277 |

* cited by examiner

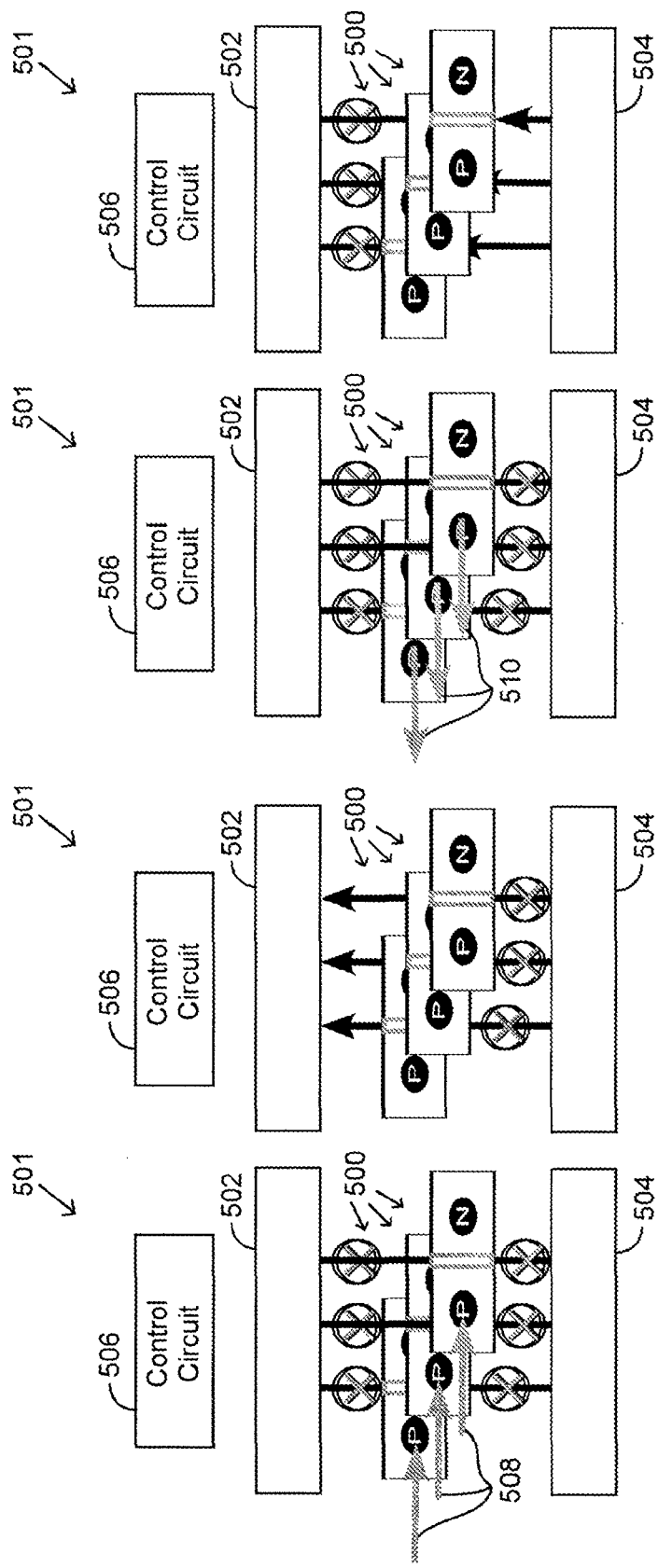

METHODS AND SYSTEMS FOR SOLID STATE HEAT TRANSFER

This application is a continuation of U.S. patent application Ser. No. 13/050,555, entitled METHODS AND SYSTEMS FOR SOLID STATE HEAT TRANSFER, filed on Mar. 17, 2011 and is incorporated herein by reference in its entirety.

BACKGROUND

Many known thermoelectric devices utilize the Peltier effect for heating or cooling. Typically, a direct current is provided across a semiconductor material and/or across an array of interconnected semiconductor materials of different types (e.g., semiconductor materials having different doping properties). As a result of the current, the junction either generates heat or rejects heat (cooling). The heating or cooling effect of thermoelectric devices is used in a number of contexts ranging from superconductivity to microprocessor cooling devices to electric beverage coolers.

The Figure of Merit (FOM) describing the performance of typical thermoelectric devices is given by Equation (1) below:

$$Z = S_e^2 k_e / k_T \tag{1}$$

In Equation (1), Z is the FOM; $S_e$ is the Seebeck coefficient of the device; $k_e$ is the electrical conductivity of the device and $k_T$ is the thermal conductivity. It can be seen that the performance of thermoelectric devices (Z) is proportional to electrical conductivity and inversely proportional to thermal conductivity. In other words, high electrical conductivity of the device material improves performance, while high thermal conductivity of the device material degrades performance. Accordingly, the ideal material for thermoelectric devices would be one that has a high electrical conductivity and a low thermal conductivity. Unfortunately, for most practical materials, electrical and thermal conductivity are proportional. As a result, existing thermoelectric devices suffer performance degradation due either to an excess of thermal conductivity or a lack of electrical conductivity.

FIGURES

Various embodiments of the present invention are described here by way of example in conjunction with the following figures, wherein.

Figure 1:
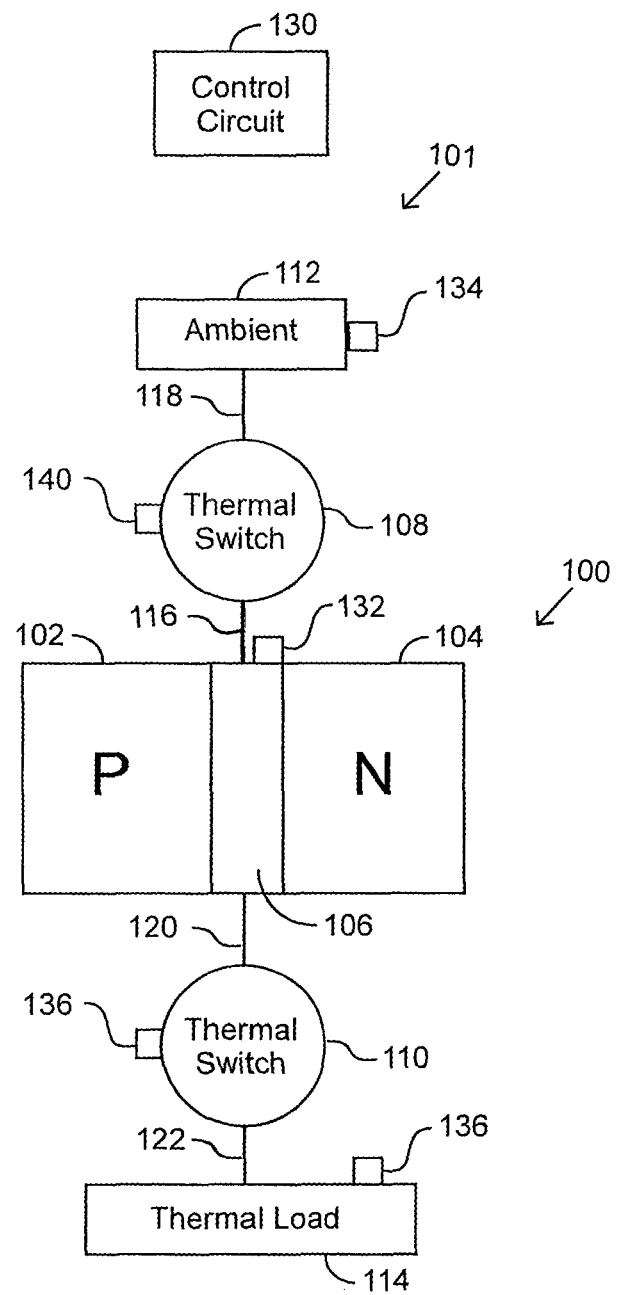
FIG. 1 illustrates a diagram showing one embodiment of a thermoelectric element.
Figure 2:
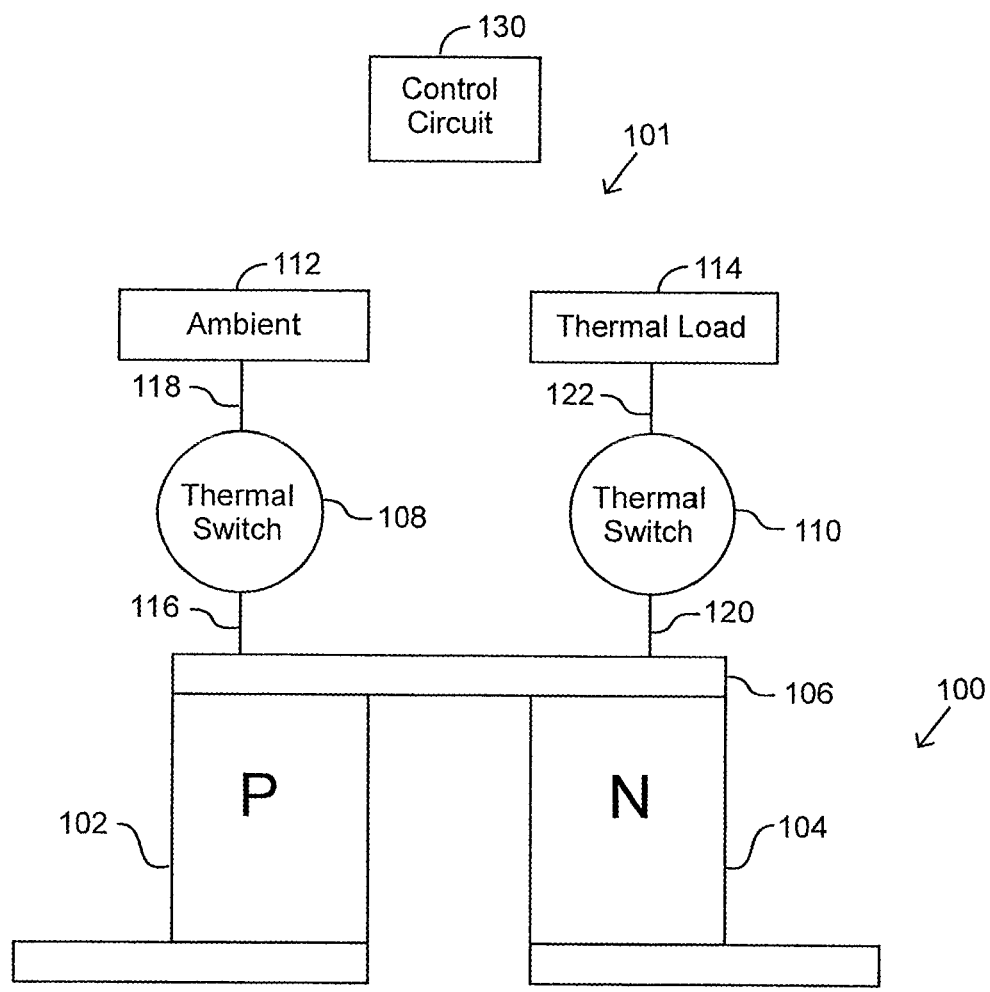
FIG. 2 illustrates a diagram showing one embodiment of an alternate configuration of the thermoelectric element of FIG. 1.
Figure 3:
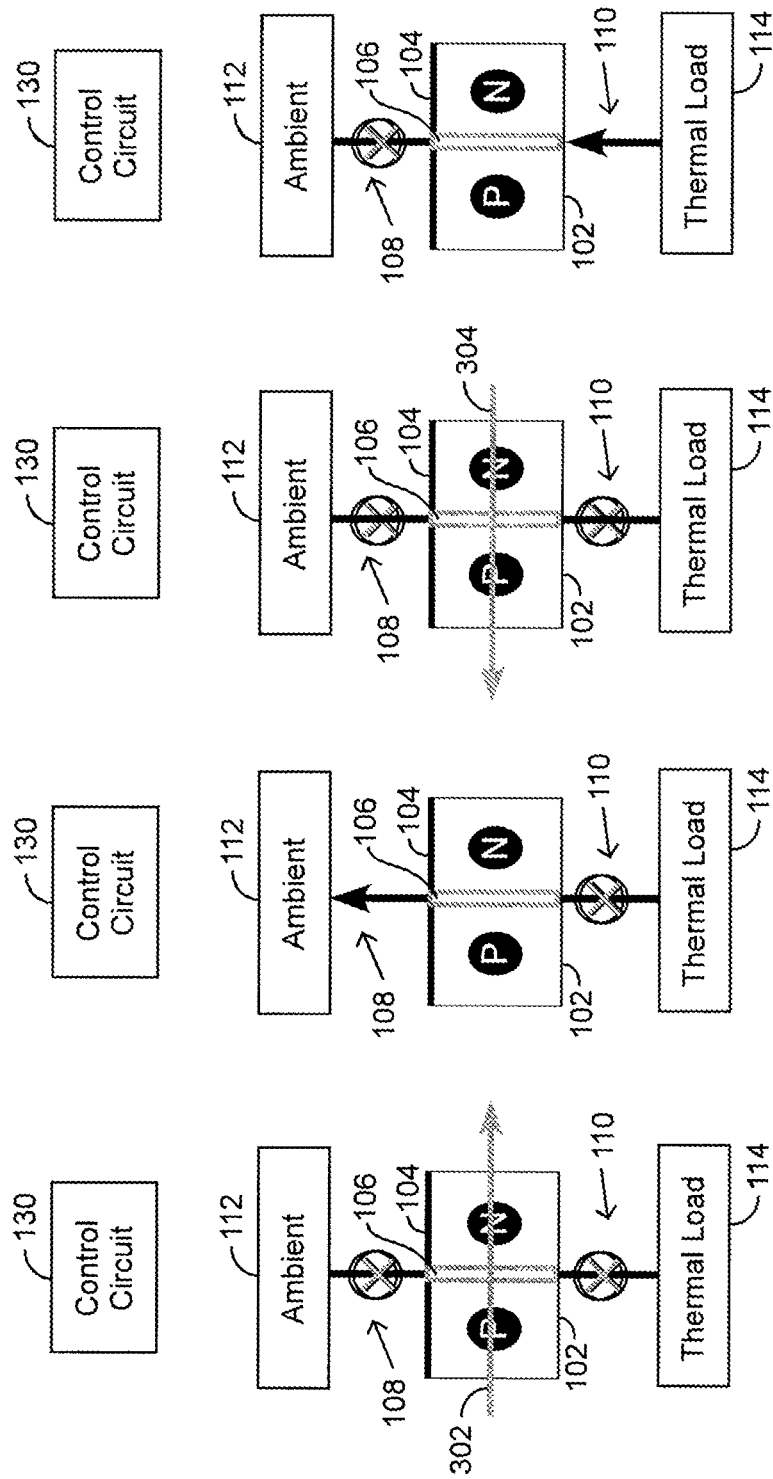

FIGS. 3(*a*)-3(*d*) illustrate a process flow showing the operation of one embodiment of the thermoelectric element of FIG. 1 or 2.

Figure 4:
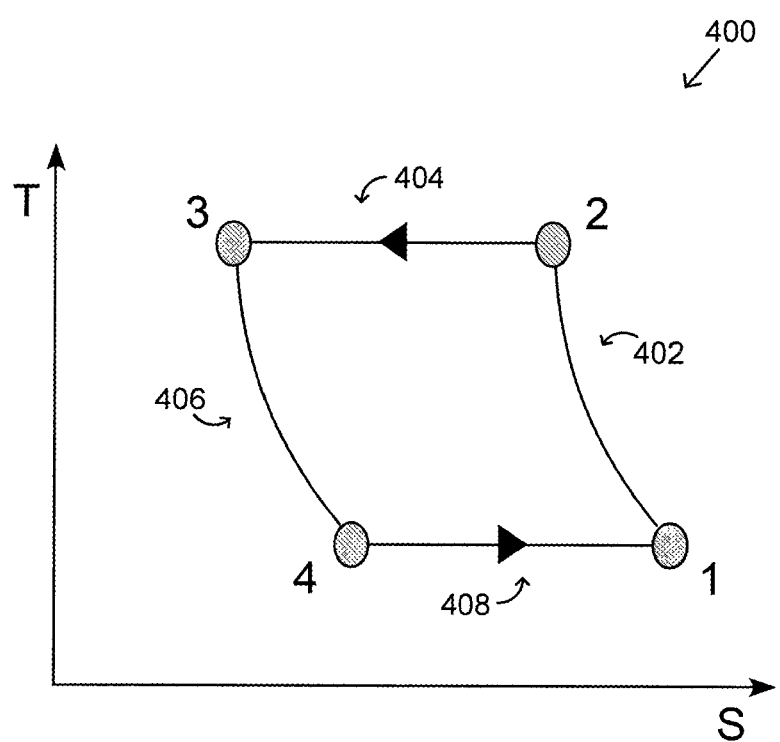

FIG. 4 is a chart illustrating a temperature-entropy (TS) cycle of the thermoelectric element, during implementation of the process flow of FIGS. 3(*a*)-3(*d*).

FIGS. 5(*a*)-5(*d*) illustrates a process flow showing the operation of one embodiment of a plurality of thermoelectric elements operating in parallel.

FIGS. 6(*a*)-6(*b*) illustrate a process flow showing the operation of one embodiment of a compound thermoelectric element.

Figure 7:
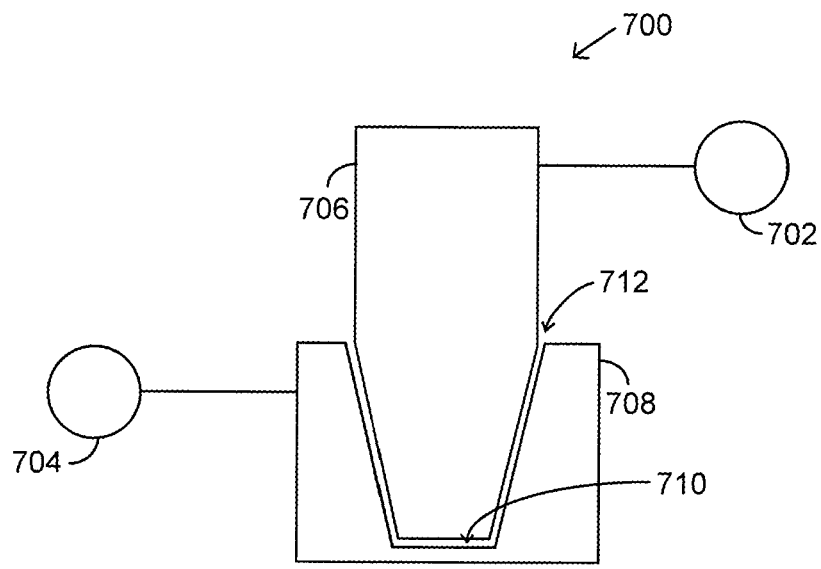

FIG. 7 illustrates a diagram of one embodiment of a heat switch.

Figure 8:
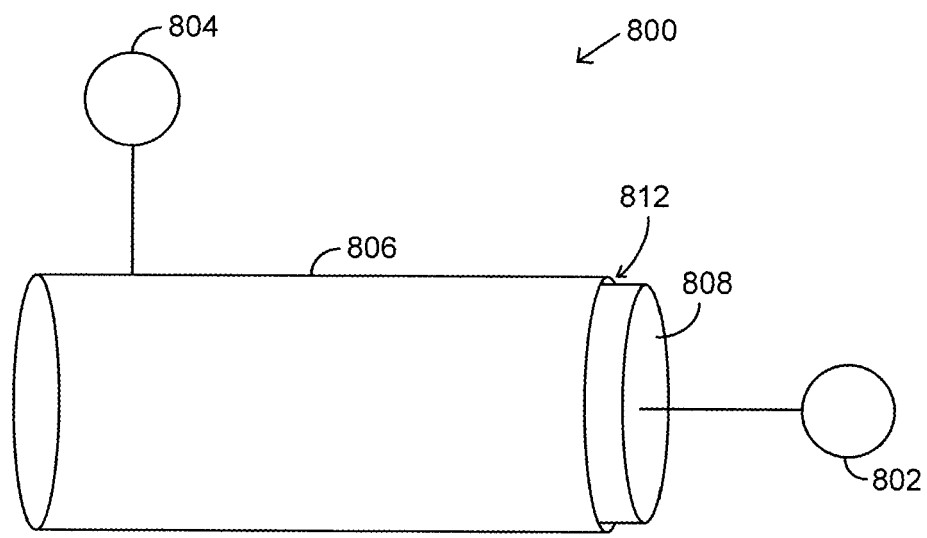

FIG. 8 illustrates a diagram of another embodiment of a heat switch.

DESCRIPTION

Various embodiments are directed to thermoelectric devices for transmitting heat energy from one thermodynamic body to another utilizing heat switches and current provided in varying directions. The devices described herein may be used to cool a body (e.g., a waste-heat generating device such as a piece of electronic or mechanical equipment, a device to be cooled for operation such as a cooler, refrigerator or superconductive material, etc.). The devices described herein may also be used, in some embodiments, to heat bodies.

According to various embodiments, the devices described herein may comprise one or more thermoelectric elements thermally positioned between a thermal reservoir (e.g., to be heated) and a thermal load (e.g., to be cooled). Each thermoelectric element may comprise a first component made from a first material and a second component made from a second material. The first component and the second component may be in electrical contact with one another via an interface which may, for example, comprise an electrically conductive material, such as a metal. The first and second materials may have different Seebeck coefficients such that current across the interface in one direction tends to generate heat at the interface and, in some embodiments, draw heat to the interface while current across the interface in the opposite direction tends to push heat away from the interface, resulting in cooling. For example, in various embodiments the first material may be p-type semiconductor material and the second material may be n-type semiconductor material. The interface may be alternately thermally coupled and thermally insulated from the thermal reservoir and thermal load via one or more heat switches. For example, a heat switch may have a first terminal and a second terminal. When the temperature differential across the first and second terminals exceeds a heat switching threshold, the heat switch may close, creating a thermally conductive path between the first and second terminals. Similarly, when the temperature differential across the first and second terminals drops below the heat switching threshold, the heat switch may open, thermally insulating the first and second terminals.

In use, a control circuit may cause electric current to flow, across the interface in a first direction, causing the interface to heat. This may raise the temperature differential between the interface and the thermal reservoir, causing the first heat switch to close, thereby allowing heat from the interface to be dissipated to the thermal reservoir (e.g., ambient air or other material). When enough heat is dissipated to reduce the differential between the interface and the thermal reservoir, the first heat switch may re-open. The control circuit may alternately cause electric current to flow across the interface in a second direction, opposite the first, causing the interface to cool. Cooling the interface may increase the temperature differential between the interface and the thermal load and may, in some embodiments, generate heat on its own. This may, in turn, cause the second heat switch to close, allowing heat from the thermal load to be transferred to the interface until the temperature differential between the interface and the thermal load drops below a threshold for the second heat switch, at which point the second heat switch may close, thermally isolating the interface from the thermal load. In this way, the thermoelectric element may operate as a heat pump to pump heat away from the thermal load and towards the thermal reservoir. Also, in some embodiments, the operation of the heat switches may serve to prevent undesirable heat conduction in the thermoelectric element, mitigating efficiency losses due to thermal conductivity.

FIG. 1 illustrates a diagram showing one embodiment of a thermoelectric device 100. The device 101 may comprise a thermoelectric element 100. The thermoelectric element 100 may comprise a first component 102 and a second component 104 in electrical contact with one another at an interface 106. The first and second components 102, 104 may be made from and/or may contain materials having different Seebeck coefficients such that current across the first and second components 102, 104 in a first direction causes cooling at the interface 106 and current across the first and second components 102, 104 in a second direction causes heating at the interface 106. For example, in various embodiments, the first component 102 may be made from and/or contain p-type semiconductor while the second component 104 may be made from and/or contain n-type semiconductor. In embodiments where the components 102, 104 are made from different kinds of semiconductors, the element 100 may be configured such that the p-type and n-type materials do not create a rectifying pn junction. For example, it may be possible to pass current from p-to-n as well as from n-to-p. This may be achieved in any suitable manner. For example, the interface 106 may be made from and/or include a metal or other conductive material that may form an ohmic connection with one or both of the components 102, 104. In various embodiments, the interface 106 may electrically separate the components 102, 104 by a distance exceeding the thickness of a hypothetical depletion region that would result from joining the first and second components 102, 104.

The thermoelectric device 101 may also comprise first and second heat switches 108, 110 alternately creating and blocking thermal connections between the interface 106 and an ambient thermal reservoir 112 on the one hand, and a thermal load 114 on the other hand. The heat switch 108 may have a first terminal 116 in thermal contact with the interface 106 and a second terminal 118 in thermal contact with the thermal reservoir or ambient 112. The thermal reservoir or ambient 112 may be a thermal mass that may receive heat from the element 100. For example, the thermal reservoir or ambient 112 may be the ambient air or other material surrounding the element 100. The heat switch 110 may have a first terminal 120 in thermal contact with the interface 106 and a second terminal 120 in thermal contact with a thermal load 114. The thermal load 114, for example, may be an object to be cooled such as a sensor, microprocessor, etc. Each of the heat switches 108, 110 may have an open state, where the respective heat switch terminals 116, 118, 120, 122 are thermally isolated from one another and a closed state where the respective terminals are in thermal contact with one another. The heat switches 108, 110 may be actuated in any suitable manner. For example, in some embodiments, the heat switches may be actuated between closed and open states by a control circuit 130, as described below. Further, in some embodiments, the heat switches 108, 110 may be thermal switches that are actuated between closed and open states, for example, based on a temperature differential across the respective heat switches 108, 110. For example, when the temperature differential exceeds a closing threshold, a thermal switch may close. When the temperature differential drops below an opening threshold, the thermal switch may open. According to various embodiments, one-way thermal switches may be used. One-way thermal switches may open or close only in response to temperature differentials in one direction. For example, switch 108 may be a one-way switch that closes in response to the interface 106 becoming warmer relative to the ambient 112 and opens in response to the interface 106 becoming cooler relative to the ambient 112.

A control circuit 130 may control operation of the device 101. For example, the control circuit 130 may control the presence or absence, as well as the direction, of current passed through the components 102, 104 and interface 106 of the element. For example, the control circuit 130 may comprise and/or be in communication with one or more power supplies for generating current. Further, in some embodiments, the control circuit 130 may control actuation of the heat switches 108, 110, as described herein. According to various embodiments, the control circuit 130 may be in communication with various sensors for sensing the state of device 101 parts. For example, temperature sensors 132, 134, 136 may be in communication with the control circuit 130 to provide temperature information describing temperatures of the interface 106, the ambient 112 and the thermal load 114, respectively. Also, in some embodiments, the control circuit 130 may be in communication with sensors 138, 140 for sensing the position of the heat switches 110, 108, respectively. The control circuit 130 itself may be any suitable form of control device including, for example, an analog circuit, a digital circuit, a mixed analog and digital circuit, etc. In some embodiments, the control circuit 130 may comprise a microprocessor.

FIG. 2 illustrates a diagram showing one embodiment of an alternate configuration of the thermoelectric device 101. The device 101, as shown in FIG. 2, demonstrates that many different spatial configurations are possible. For example, in FIG. 2, the interface 106 is illustrated connecting non-adjacent sides of the components 102, 104. It will be appreciated that any suitable configuration may be used.

FIGS. 3 and 4 illustrate the operation of one embodiment of the thermoelectric device 101. FIG. 3(a)-3(d) illustrate a process flow showing the operation of one embodiment of the thermoelectric device 101. FIG. 4 is a chart 400 illustrating a temperature-entropy (TS) cycle of the thermoelectric device 101 during implementation of the process flow of FIGS. 3(a)-3(d). In FIG. 4, temperature, or T is indicated on the vertical y-axis, while entropy or S is indicated on the horizontal x-axis.

Referring now to FIG. 3(a), the control circuit 130 may cause a current (indicated by arrow 302) to flow across the interface 106 from the component 102 to the component 104 (e.g., from p-type material to n-type material). Both of the heat switches 108 and 110 may be open, preventing heat transfer between the interface 106 and either the ambient 112 or the thermal load 114. The current 302 from p-type to n-type may cause the interface 106 to heat. The TS characteristics of the thermoelectric element 100 in the configuration shown in FIG. 3(a) are illustrated by curve 402 of the TS chart 400. As illustrated, the entropy of the element 100 may decrease slightly, while the temperature increases as the interface 106 heats.

As the interface 106 heats, a temperature differential between the interface 106 and the ambient 112 may increase. When the temperature differential exceeds a closing threshold of the heat switch 108, the heat switch 108 may close, creating a thermally conductive path between the interface 106 and the ambient 112. At or about the closing of the heat switch 108, the control circuit 130 may cause the current 302 to cease. This configuration is illustrated in FIG. 3(b). With the heat switch 108 closed and the current 302 turned off, heat from the interface 106 may be released to the ambient.

This process is illustrated in FIG. 4 by curve 404. As shown, the temperature of the element 100 may stay roughly constant, while the entropy of the element decreases as heat is lost to the ambient 112. In embodiments where the heat switch 108 is controlled by the control circuit 130, the control circuit 130 may close the heat switch based a signal received from one or more sensors 132, 134 indicating the temperature differential between the interface 106 and the ambient 112 or upon the occurrence of any other suitable condition (e.g., the passage of a predetermined time from the initiation of the current 302, the passage of a predetermined level of charge through the components 102, 104 and interface 106 from the current 302, etc.).

As heat is released to the ambient 112, the temperature differential between the ambient 112 and the interface 106 may decline. When the temperature differential between the ambient 112 and the interface 106 declines below an opening threshold of the heat switch 108, the heat switch 108 may open, causing substantial thermal isolation between the interface and the ambient 112. In embodiments where the heat switch 108 is controlled by the control circuit 130, the control circuit 130 may open the switch 108, for example, based on a determination of the temperature differential between the ambient 112 and the interface 106 received from the sensors 132, 134 and/or any other suitable criteria (e.g., the passage of a predetermined amount of time from the closing of the switch 108).

At or about the opening of the heat switch 108, the control circuit 130 may cause a current, indicated by arrow 304, to flow across the interface 106 from the component 104 to the component 102 (e.g., from n-type to p-type). The current 304 may cause cooling at the interface 106. For example, the current 304 may drive heat away from the interface 106. The configuration of the element 100 with the heat switch 108 open and the current 304 flowing from n-type to p-type is shown in FIG. 3(c). The TS properties of the element 100, as illustrated in FIG. 3(c) are shown by curve 406 of the chart 400. As illustrated, the temperature of the element 100 may decline, while the entropy increases.

As the temperature of the interface 106 declines, the temperature differential between the interface 106 and the thermal load 114 may increase. When this temperature differential exceeds a closing threshold of the heat switch 110, the heat switch 110 may close, creating a thermally conductive path between the interface 106 and the thermal load 114. In embodiments where the heat switch 110 is actuated by the control circuit 130, the control circuit 130 may determine when to close the heat switch 110 based, for example, on temperature readings received from sensors 132 and 136 indicating the temperature differential between the interface 106 and the thermal load 114 and/or any other suitable criteria (e.g., the passage of a predetermined time from the initiation of the current 302, the passage of a predetermined level of charge through the components 102, 104 and interface 106 from the current 304, etc.).

At or about the time that the heat switch 110 closes, the control circuit 130 may cause the current 304 to cease, resulting in the configuration of the element 100 shown in FIG. 3(d). Thermal energy generated by the thermal load 114 may propagate from the relatively hot thermal load 114 to the relatively cold interface 106. The TC properties of the element 100, as illustrated in FIG. 3(d), are shown by the curve 408. As illustrated, the temperature of the element 100 may remain about constant, while the entropy of the element 100 may increase.

As heat energy from the thermal load 114 is transferred to the interface 106, the temperature differential between the thermal load 114 and the interface 106 may decline until it reaches an opening threshold of the heat switch 110. At this point, the heat switch 110 may open causing substantial thermal isolation between the thermal load 114 and the interface 106. At or about the opening of the heat switch 110, the control circuit 130 may cause the current 302 to flow, as illustrated in FIG. 3(a). In embodiments where the heat switch 110 is controlled by the control circuit 130, the control circuit 130 may open the switch 110, for example, based on a determination of the temperature differential between the thermal load 114 and the interface 106 received from the sensors 132, 134 and/or any other suitable criteria (e.g., the passage of a predetermined amount of time from the closing of the switch 110). The process may continue in this manner as long as desired. In this way, the element 100 may pump heat from the thermal load 114 to the ambient 112.

According to various embodiments, the control circuit 130 may utilize the sensors 132, 134, 136, 138, 140 to control the various components of the element 100 to implement the process flow shown in FIGS. 3(a)-3(d). For example, the control circuit 130 may receive a signal indicating that the switch 108 is either open or about to open, indicating that the current 302 should be stopped. The signal may, for example, originate from sensor 140, which may indicate a state of the switch 108. In some embodiments, the signal may be received from one or both of the sensors 132, 134, which (e.g., collectively) may indicate a temperature differential between the ambient 112 and the interface 106. The control circuit 130 may initiate the current 304 upon receiving a signal indicating that the switch 108 has closed or is about to close (e.g., from one or more of sensors 140, 132, 134). Similarly, the control circuit 130 may receive information about the state of the switch 110 and/or the temperature of the interface 106 and thermal load 114 via sensors 138, 132, and 136. This information may be used by the control circuit 110 to initiate and stop the current 304, as described above.

As described above, the control circuit 130 may, in some embodiments, also control the actuation of the heat switches 108, 110. For example, the control circuit 130 may sense the temperature(s) of the ambient 112, thermal load 114 and interface 106 (e.g., via sensors 134, 136 and 132). When the opening and/or closing thresholds of the heat switches 108, 110, are reached, the control circuit 130 may cause the appropriate switch 108, 110 to open or close, for example, as described above. For example, the switches 108, 110 may comprise components that may be brought into physical contact, and therefore thermal contact, with one another on command of the control circuit 130 (e.g., through the use of one or more stepper motors, solenoids, magnetic fields, etc.). Other example heat switches 108, 110 may comprise microelectronic machines (MEMS) and/or nano components actuated piezoelectrically and/or electrostatically. In other embodiments, the switches 108, 110 may comprise voids that may be alternately filled and emptied of a conductive gas, such as, for example, helium.

According to various embodiments, multiple thermoelectric elements may be utilized in parallel. Figure s 5(a)-5(d) illustrates a process flow showing the operation of one embodiment of a thermoelectric device 501 comprising a plurality of thermoelectric elements 500 operating in parallel. The thermoelectric elements 500 may be elements, such as elements 100 of FIGS. 1 and 2, described above. For example, each of the thermoelectric elements 500 may comprise first and second components in electrical contact with one another at an interface, paralleling the first and second components 102, 104 and interface 106 described above. The elements 500 may be connected in parallel. For example, the interfaces of each of the elements 500 may be thermally connected to a common ambient or thermal reservoir 502 via heat switches, paralleling the heat switch 108 described herein. Further, the interfaces of the elements 500 may also be thermally connected to a common thermal load 504 via heat switches paralleling the heat switch 110 described herein. A control circuit 506 may be constituted and operate similar to the control circuit 130 described above. According to various embodiments, the control circuit 506 may control each of the thermoelectric elements 500 collectively. Also, in some embodiments, the control circuit 506 may comprise multiple portions that may or may not be in communication with one another, with each portion independently controlling one or more of the thermoelectric elements 500.

As illustrated in FIG. 5(a), the control circuit 506 may cause a current 508 to flow across the interfaces of the elements 500 in a direction tending to cause the interfaces to cool (e.g., from p-type material to n-type material). In this way, each of the elements 500, as depicted in FIG. 5(a) may operate in a manner similar to the element 100 as depicted in FIG. 3(a). The interfaces of the elements 500 may heat, while the heat switches connecting the interfaces of the elements 500 to the common ambient 502 and the common thermal load 504 may be open, thermally isolating the elements from the ambient 502 and thermal load 504. As the temperature of the interfaces of the elements 500 increases, the temperature differential between the interfaces of the elements 500 and the common ambient 502 may increase to or above a closing threshold of the heat switches separating the elements 500 from the common ambient 502. This may cause these heat switches to close, resulting in a thermal connection between the interfaces of the elements 500 and the common ambient 502. Alternatively, the control circuit 506 may close the switches based on any suitable criteria. At or about the closing of the switches between the elements 500 and the common ambient 502, the control circuit 506 may cause the current 508 to cease. An example configuration of the elements 500 in this state is shown by FIG. 5(b). As shown in FIG. 5(b), each individual element may be configured, and may operate, in a manner similar to that described above with respect to FIG. 3(b). For example, heat energy concentrated at the interfaces of the elements 500 may be conducted and/or dissipated to the common ambient 502.

As the temperature differential between the elements 500 and the common ambient 502 decreases, the switches separating the interfaces of the elements 500 from the common ambient 502 may open, causing substantial thermal isolation between the elements 500 and the common ambient 502. (E.g., the switches may open when the temperature differential between the elements 500 and the common ambient 502 reaches and/or exceeds an opening threshold, or as determined by the control circuit 506.) At or about the opening of the switches between the elements 500 and the common ambient, the control circuit 506 may cause a current 510 to flow through the elements 500 in a direction that causes cooling of the respective interfaces (e.g., from n-type material to p-type material). This configuration is illustrated in FIG. 5(c). The configuration and operation of each individual thermoelectric element 500 shown in FIG. 5(c) may be similar to the operation of the element 100, as illustrated in FIG. 3(c). For example, the interfaces of the elements 500 may cool as heat is driven away from the interfaces. As the elements 500 cool, the temperature differential between the interfaces of the elements 500 and the common thermal load 504 may increase until reaching or exceeding a closing threshold of the heat switches between the interfaces of the elements 500 and the common thermal load 504. When the differential reaches or exceeds the closing threshold of the heat switches between the interfaces of the switches between the interfaces of the elements 500 and the common thermal load 504. At or about the closing of these switches, the control circuit 506 may cause the current 510 to cease.

FIG. 5(d) shows the device 501 after the cessation of the current 510 and after the switches between the interfaces of the elements 500 and the common thermal load 504 have closed (e.g., in response to temperature differentials between the interfaces and common thermal load 504 or by the control circuit 506). The configuration and operation of each individual thermoelectric element 500 shown in FIG. 5(d) may be similar to the operation of the element 100, as illustrated in FIG. 3(d). For example, heat from the common thermal load 504 may flow to the elements 500 until the temperature differential between the interfaces of the elements 500 is reduced to or below an opening threshold of the relevant switches, at which point the switches may close. At or about the closing of the switches (e.g., the switches between the interfaces of the elements 500 and the common thermal load 504), the control circuit 506 may begin the current 508, putting the elements 500 in the configuration shown in FIG. 5(a). The process may continue as long as desired and may have the effect of transferring heat from the common thermal load 504 to the common ambient 502. The use of multiple thermoelectric elements 500 in the device may increase the capacity of the system compared to the use of only a single element 100 in the device 101.

Figure 6A:
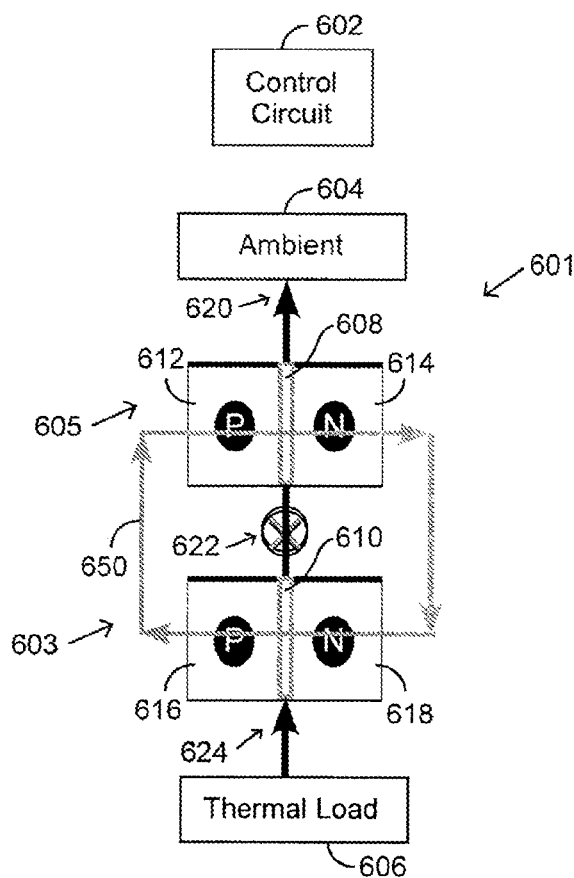
Figure 6B:
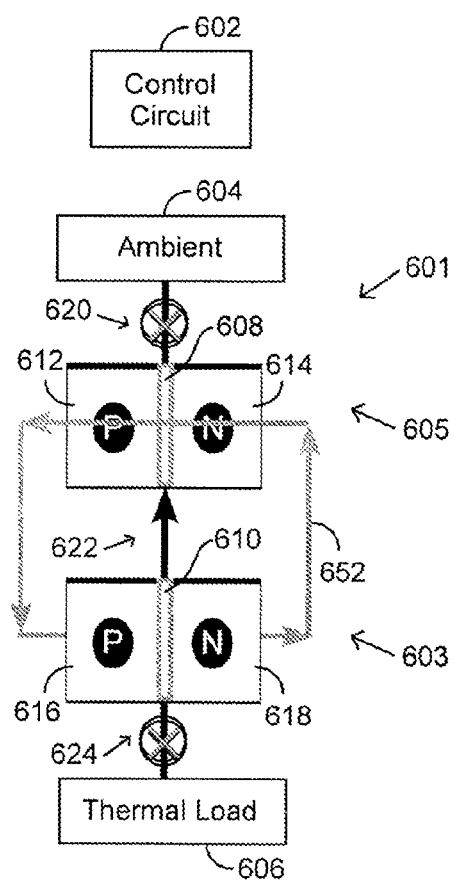

FIGS. 6(a)-6(b) illustrate a process flow showing the operation of one embodiment of a compound thermoelectric device 601. The compound thermoelectric element may comprise one or more thermoelectric elements 605, 603 connected to each other, to an ambient or thermal reservoir 604, and to a thermal load 606 by heat switches 620, 622, 624. Element 605 may comprise a first component 612 and a second component 614 electrically connected by an interface 608. Similarly, element 603 may comprise a first component 616 and a second component 618 electrically connected by an interface 610. The respective first components 612, 616, second components 614, 618 and interfaces 608, 610 of the elements 605, 603 may be connected in a manner similar to that illustrated and described above with respect to the thermoelectric element 100. For example, the first components 612, 616 and the second components 614, 618 may be made from materials (e.g., p-type and n-type semiconductor material, respectively) that have different Seebeck coefficients such that current across the first components 612, 616 and second components 614, 618 causes cooling at the interfaces 608, 610 in a first direction and heating at the interfaces 608, 610 in second direction. Also, the electrical connections between the respective first components 612, 616 and second components 614, 618 may not create rectifying pn junctions, as described herein above.

In a first state of operation, as illustrated by FIG. 6(a), the control circuit may cause a first current 650 to flow across the respective elements 605, 603 in the direction shown. For example, the current 650 may flow across the element 605 from component 612 to component 614 (e.g., from p-type to n-type). Accordingly, the element 605 (e.g., at the interface 608) may heat. The current 650 may also flow across the element 603 from component 618 to component 616 (e.g., from n-type to p-type). This may cause the element 603

(e.g., at the interface 610) to cool. Although the current 650 is illustrated and described as a single current, it will be appreciated that current across the first element 605 and current across the element 603 may be separate currents (e.g., separately generated, separately switched, etc.).

Heat at the interface 608 may cause a temperature differential between the interface 608 and the ambient 604 to exceeding a closing threshold of the heat switch 620, causing it to close and allowing heat from the interface 608 to be conducted from the element 605 and interface 608 to the ambient 604. Similarly, a lack of heat (e.g., cool) at the interface 610 may cause a temperature differential between the interface 610 and the thermal load 606 exceeding a closing threshold of the heat switch 624, causing it to close and allowing heat from the thermal load 606 to be conducted to the element 603 (e.g., the interface 610). As shown in FIG. 6(a), the heat switch 622 may be open creating substantial thermal isolation between the elements 605, 603. Alternatively, the positions of the respective switches 620, 622, 624 may be controlled by the control circuit 602, according to any suitable method.

According to various embodiments, the heat switch 622 may be a one-way heat switch. For example, in the configuration illustrated in FIG. 6(a), the interface 608 is heated while the interface 610 is cooled. Accordingly, there may be a significant temperature differential from hot to cold between the interface 608, 610. The heat switch 622, in various embodiments, may not close in response to a temperature differential in this direction. For example, the heat switch 622 may only close in response to a temperature differential when the interface 610 is hotter than the interface 608. In various embodiments, the other heat switches 620, 624 may be similarly one-way. This may prevent the switches 620, 624 from closing, and thus disrupting the operation of the thermoelectric device 601 due to extreme heat at the thermal load 606 and/or extreme cold at the ambient 604.

Referring now to FIG. 6(b), the control circuit 602 may cause the current 650 to cease and cause a current 652 to flow in a direction opposite to that of the current 650. This current may heat the interface 610 of the element 603 and cool the interface of the element 605. Cooling of the interface 608 may cause the temperature differential between the interface 608 and the ambient 604 to drop below an opening threshold of the heat switch 620, causing the heat switch 620 to open and resulting in substantial thermal isolation between the element 605 and the ambient 604. Similarly, heating of the interface 610 may cause the temperature differential between the interface 610 and the thermal load 606 to drop below an opening threshold of the heat switch 624, causing the heat switch 624 to open and resulting in substantial thermal isolation between the element 603 and the thermal load 606. At the same time, heating of the interface 610 and cooling of the interface 608 may cause a temperature differential from the interface 608 to the interface 610 to meet or exceed a closing threshold of the heat switch 622, causing it to close and create a thermally conductive path between the interfaces 608, 610 and, thereby, between the elements 605, 603 themselves. In this way, heat drawn to the interface 610 may be conducted to the interface 608. The thermoelectric element may operate as described, alternating between the configuration of FIG. 6(a) and the configuration of FIG. 6(b) for as long as desired. In effect, the operation described may serve to pump heat from the thermal load 606 to the ambient 604. Although the current 652 is illustrated and described as a single current, it will be appreciated that current across the first element 605 and current across the element 603 may be separate currents (e.g., separately generated, separately switched, etc.). As described herein, the switches 620, 622, 624 may alternately be actuated by the control circuit 602.

FIG. 7 illustrates a diagram of one embodiment of a-heat switch 700. The heat switch 700 may be utilized as any of the switches 108, 110, 620, 622, 624 described herein. As illustrated, the heat switch 700 comprises a first terminal 702 mechanically and thermally coupled to a first switch element 706 and a second terminal mechanically coupled to a second switch element 708. The first switch element 706 may be received within a cavity 710 of the second switch element 708. When the switch 700 is in an open position, a gap 712 may exist between the first element 706 and the second element 708, preventing physical contact between the two. In some embodiments, the switch elements 706, 708 may be maintained in a vacuum to prevent heat conduction across the gap 712 by air.

The switch 700 may be opened and/or closed based on a temperature differential between its terminals 702, 704. Mechanically, the switch 700 may be closed by eliminating the gap 712 and bringing the elements 706, 708 into physical contact with one another. This may occur, for example, by some combination of thermal contraction of the element 708 and/or thermal expansion of the element 706. This combination may be brought about by a temperature differential between the terminals 702, 704. For example, when the terminal 702, and thus the element 706, is at a higher temperature than the terminal 704, and thus the element 708, the element 706 may thermally expand relative to the element 708, narrowing the gap 712. This operation could alternately be viewed as the element 708 thermally contracting relative to the element 706. Any combination of thermal expansion by the element 706 and/or thermal contraction by the element 708 may occur. The temperature differential at which the gap 712 disappears and the elements 706, 708 enter thermal contact with one another may be referred to as a closing threshold differential. According to various embodiments, the switch 700 may be considered a one-way heat switch. For example, a negative temperature differential from the terminal 704 to the terminal 702 would not cause the switch to close. Heating the terminal 704 would cause the element 708 to expand, thus tending to increase the gap 712. Cooling the terminal 702 would also tend to increase the gap 712 by thermally contracting the element 706.

Once closed, the switch 700 may be re-opened according to any suitable mechanism. For example, reducing or reversing the temperature differential between the terminals 702 and 704 may cause differential expansion of the elements 706, 708 sufficient to recreate the gap 712 despite the fact that the elements 706, 708 are in thermal contact with one another when the switch 700 is closed. For example, while there is a temperature differential between the terminals 702, 704, there may be a temperature gradient between the terminals 702, 704, across the elements 706, 708. Accordingly, the elements 706, 708 may not expand or contract uniformly (e.g., because one or both of the elements 706, 708 may not have a single, uniform temperature). When the temperature differential between the terminals 702, 704 reaches a value that causes a large enough portion of the element 706 to thermally contract, and/or a large enough portion of the element 708 to expand, contact between the elements 706, 708 may be broken. This may recreate the gap 712, causing substantial thermal isolation between the elements 706, 708 and the terminals 702, 704. The temperature differential which causes the switch 700 to open may be referred to as the opening temperature differential threshold.

The opening temperature differential threshold may, or may not, be equal to the closing temperature differential threshold.

According to various embodiments, the elements 706, 708 may be made from different materials having different coefficients of thermal expansion. In this way, the closing and/or closing temperature differential threshold may be dependent on absolute temperatures of the terminals 702, 704. FIG. 8 illustrates a diagram of another embodiment of a heat switch 800 actuated by thermal differentials. The heat switch 800 may operate in a manner similar to that of the switch 700 and may have similar properties. A terminal 802 may be in thermal communication with a roughly cylindrical element 802 that may be received within a hollow element 806, in thermal communication with a terminal 804. A gap 812 between the elements 806, 808 may ensure substantial thermal isolation. Some combination of thermal expansion by the element 808 and/or thermal contraction by the element 806 may eliminate the gap 812, bring the elements 806, 808 (and the terminals 802, 804) into thermal contact with one another. The switch 800 may have a closing temperature differential threshold and an opening temperature differential threshold, for example, as described herein with respect to switch 700.

The examples presented herein are intended to illustrate potential and specific implementations of the present invention. It can be appreciated that the examples are intended primarily for purposes of illustration of the invention for those skilled in the art. No particular aspect or aspects of the examples are necessarily intended to limit the scope of the present invention. For example, no particular aspect or aspects of the examples of system architectures, methods described herein are necessarily intended to limit the scope of the invention.

It is to be understood that the figures and descriptions of the present invention have been simplified to illustrate elements that are relevant for a clear understanding of the present invention, while eliminating, for purposes of clarity, other elements. Those of ordinary skill in the art will recognize, however, that these sorts of focused descriptions would not facilitate a better understanding of the present invention, and therefore, a more detailed description of such elements is not provided herein.

Moreover, the processes associated with the present example embodiments (e.g., process flows shown by FIGS. 3(a)-3(d), 5(a)-5(d) and 6(a)-6(b)) may be executed by programmable equipment (e.g., control circuits 130, 506, 602, etc.), such as computers. Software or other sets of instructions that may be employed to cause programmable equipment to execute the processes. The processes may be stored in any storage device, such as; for example, a computer system (non-volatile) memory, an optical disk, magnetic tape, or magnetic disk. Furthermore, some of the processes may be programmed when the computer system is manufactured or via a computer-readable memory medium.

It can also be appreciated that certain process aspects described herein may be performed using instructions stored on a computer-readable memory medium or media that direct a computer or computer system (e.g., control circuits 130, 506, 602, etc.) to perform process steps. A computer-readable medium may include, for example, any non-transitory media such as, for example, memory devices such as diskettes, compact discs of both read-only and read/write varieties, optical disk drives, and hard disk drives. A computer-readable medium may also include memory storage that may be physical, virtual, permanent, temporary, semi-permanent and/or semi-temporary. It will be appreciated that the term non-transitory refers to the medium and not to any data stored thereon. For example, a random access memory (RAM) is non-transitory, although the data stored thereon may change regularly.

A "computer," "machine," "computer device," "host," "engine," or "processor" may be, for example and without limitation, a processor, microcomputer, minicomputer, server, mainframe, laptop, personal data assistant (PDA), wireless e-mail device, cellular phone, pager, processor, fax machine, scanner, or any other programmable device configured to transmit and/or receive data over a network. Computer systems and computer-based devices disclosed herein may include memory for storing certain software applications used in obtaining, processing, and communicating information. It can be appreciated that such memory may be internal or external with respect to operation of the disclosed example embodiments. The memory may also include any means for storing software, including a hard disk, an optical disk, floppy disk, ROM (read only memory), RAM (random access memory), PROM (programmable ROM), EEPROM (electrically erasable PROM) and/or other computer-readable memory media.

In various example embodiments of the present invention, a single component may be replaced by multiple components, and multiple components may be replaced by a single component, to perform a given function or functions. Except where such substitution would not be operative to practice embodiments of the present invention, such substitution is within the scope of the present invention. Any of the servers or computer systems described herein, for example, may be replaced by a "server farm" or other grouping of networked servers (e.g., a group of server blades) that are located and configured for cooperative functions. It can be appreciated that a server farm may serve to distribute workload between/among individual components of the farm and may expedite computing processes by harnessing the collective and cooperative power of multiple servers. Such server farms may employ load-balancing software that accomplishes tasks such as, for example, tracking demand for processing power from different machines, prioritizing and scheduling tasks based on network demand, and/or providing backup contingency in the event of component failure or reduction in operability.

While various embodiments have been described herein, it should be apparent that various modifications, alterations, and adaptations to those embodiments may occur to persons skilled in the art with attainment of at least some of the advantages. The disclosed embodiments are therefore intended to include all such modifications, alterations, and adaptations without departing from the scope of the embodiments as set forth herein.

We claim:

1. A thermoelectric device comprising:
   a thermoelectric element comprising a first component and a second component with an interface between the first component and the second component;
   a first heat switch comprising a first terminal in thermal contact with the interface and a second terminal in thermal contact with a thermal reservoir;
   a second heat switch comprising a first terminal in thermal contact with the interface and a second terminal in thermal contact with a thermal load; and
   a control circuit configured to:
      with the first and second heat switches open, initiate a first current across the thermoelectric element from the first component to the second component causing the interface to heat;

determine that a temperature difference between the interface and the thermal reservoir is greater than a closing threshold for the first heat switch;
close the first heat switch creating a thermally conductive path between the interface and the thermal reservoir;
stop the first current, wherein after the stopping of the first current, heat from the interface is transferred to the thermal reservoir;
determine that the temperature difference between the interface and the thermal reservoir is less than the closing threshold for the first heat switch;
open the first heat switch;
initiate a second current across the thermoelectric element from the second component to the first component causing the interface to cool;
determine that a temperature difference between the interface and the thermal load is greater than a closing threshold for the second heat switch; and
close the second heat switch creating a thermally conductive path between the interface and the thermal load.

2. The thermoelectric device of claim 1, wherein the control circuit is further configured to:
stop the second current, wherein after the stopping of the second current, heat from the thermal load is transferred to the interface;
determine that the temperature difference between the interface and the thermal load is less than the closing threshold for the second heat switch; and
open the second heat switch.

3. The thermoelectric device of claim 2, wherein the first component comprises a p-type semiconductor and the second component comprises an n-type semiconductor.

4. The thermoelectric device of claim 2, wherein the thermal reservoir is an ambient environment of the thermoelectric element.

5. The thermoelectric device of claim 2, wherein the thermal load is a device generating waste heat.

6. The thermoelectric device of claim 2, wherein the first component and the second component are not in physical contact with one another.

7. The thermoelectric device of claim 6, wherein the interface comprises an electrically conductive component physically separating the first component and the second component.

8. The thermoelectric device of claim 1, further comprising:
a second thermoelectric element comprising a first component and a second component with an interface between the first component and the second component;
a third heat switch comprising a first terminal in thermal contact with the interface of the second thermoelectric element and a second terminal in thermal contact with the thermal reservoir;
a fourth heat switch comprising a first terminal in thermal contact with the interface of the second thermoelectric element and a second terminal in thermal contact with the thermal load; and
wherein the control circuit is further configured to:
initiate a third current to flow across the second thermoelectric element from the first component to the second component causing the interface of the second thermoelectric element to heat;
determine that a temperature difference between the interface of the second thermoelectric element and the thermal reservoir is greater than a closing threshold for the third heat switch; and
close the third heat switch causing a thermally conductive path between the interface of the second thermoelectric element and the thermal reservoir.

9. The thermoelectric device of claim 8, wherein the control circuit is further configured to:
stop the third current, wherein after the stopping of the third current, heat from the interface of the second thermoelectric device is transferred to the thermal reservoir;
determine that the temperature difference between the interface of the second thermoelectric element and the thermal reservoir is less than the closing threshold for the third heat switch;
open the third heat switch;
initiate a fourth current across the second thermoelectric element from the second component to the first component causing the interface of the second thermoelectric element to cool;
determine that a temperature difference between the interface of the second thermoelectric element and the thermal load is greater than a closing threshold for the fourth heat switch;
close the fourth heat switch creating a thermally conductive path between the interface and the thermal load;
stop the fourth current, wherein after stopping the fourth current, heat from the thermal load is transferred to the interface of the second thermoelectric element;
determine that the temperature difference between the interface of the second thermoelectric element and the thermal load is less than the closing threshold for the fourth heat switch; and
open the fourth heat switch.

10. The thermoelectric device of claim 9, wherein the first and third currents are concurrent, and wherein the second and fourth currents are concurrent.

11. The thermoelectric device of claim 1, further comprising a temperature sensor positioned to sense a temperature of the interface; a temperature sensor positioned to sense a temperature of the thermal reservoir; and a temperature sensor positioned to sense a temperature of the thermal load.

12. A thermoelectric device comprising:
a first thermoelectric element comprising a first component and a second component with an interface between the first component and the second component;
a second thermoelectric element comprising a first component and a second component with an interface between the first component and the second component;
a first heat switch comprising a first terminal in thermal contact with the interface of the first thermoelectric element and a second terminal in thermal contact with a thermal reservoir;
a second heat switch comprising a first terminal in thermal contact with the interface of the first thermoelectric element and a second terminal in thermal contact with the interface of the second thermoelectric device;
a third heat switch comprising a first terminal in thermal contact with the interface of the second thermoelectric device and a second terminal in thermal contact with a thermal load; and
a control circuit configured to:
open the second heat switch;
initiate a first current directed across the first thermoelectric element from the first component to the second component to cause heating at the interface of the first thermoelectric element;

initiate a second current directed across the second thermoelectric element from the first component to the second component to cause cooling at the interface of the second thermoelectric element;

closing the first heat switch to create a thermally conductive path between the first thermoelectric element and the thermal reservoir, wherein heat from the first thermodynamic element is transferred to the thermal reservoir while the first heat switch is closed;

closing the third heat switch to create a thermally conductive path between the second thermoelectric element and the thermal load, wherein heat from the thermal load is transferred to the second thermoelectric element while the third heat switch is closed;

stop the first and second currents;

initiate a third current directed across the first thermoelectric element from the second component to the first component to cause cooling at the interface of the first thermoelectric element;

initiate a fourth current directed across the second thermoelectric element from the second component to the first component to cause heating at the interface of the second thermoelectric element;

open the first heat switch;
open the third heat switch; and
close the second heat switch.

13. The thermoelectric device of claim 12, wherein the first component of the first thermoelectric element comprises a p-type semiconductor and the second component of the first thermoelectric element comprises an n-type semiconductor.

14. The thermoelectric device of claim 12, wherein the thermal reservoir is an ambient environment of the first and second thermoelectric elements.

15. The thermoelectric device of claim 12, wherein the thermal load is a device generating waste heat.

16. The thermoelectric device of claim 12, wherein the first component and the second component of the first thermoelectric element are not in physical contact with one another.

17. The thermoelectric device of claim 16, wherein the interface of the first thermoelectric component comprises an electrically conductive component physically separating the first component and the second component.

18. The thermoelectric device of claim 12, wherein the first components of the first and second thermoelectric elements and the second components of the first and second thermoelectric elements are in electrical contact with each other such that the first and second currents are a common current and the third and fourth currents are a common current.

19. The thermoelectric device of claim 12, wherein the control circuit is further configured to open the first heat switch when a temperature differential between the interface and the thermal reservoir drops below a thermal switching threshold of the first heat switch.

20. The thermoelectric device of claim 12, wherein the control circuit is further configured to open the third heat switch when a temperature differential between the second interface and the thermal load drops below a thermal switching threshold of the third heat switch.

21. The thermoelectric device of claim 12, wherein, while the second heat switch is closed, heat from the second interface is dissipated, via the second heat switch, to the first interface and wherein the control circuit is further configured to open the second heat switch when a temperature differential between the second interface and the first interface drops below a thermal switching threshold of the second heat switch.

* * * * *